(12) United States Patent
Kobayashi et al.

(10) Patent No.: US 11,972,921 B2
(45) Date of Patent: Apr. 30, 2024

(54) TEMPERATURE MEASUREMENT SYSTEM, TEMPERATURE MEASUREMENT METHOD, AND SUBSTRATE PROCESSING APPARATUS

(71) Applicant: Tokyo Electron Limited, Tokyo (JP)

(72) Inventors: Takeshi Kobayashi, Iwate (JP); Tatsuo Matsudo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 799 days.

(21) Appl. No.: 17/089,949

(22) Filed: Nov. 5, 2020

(65) Prior Publication Data

US 2021/0151285 A1 May 20, 2021

(30) Foreign Application Priority Data

Nov. 15, 2019 (JP) ................................ 2019-206738

(51) Int. Cl.
*G01K 11/00* (2006.01)
*C23C 16/458* (2006.01)
(Continued)

(52) U.S. Cl.
CPC ........ *H01J 37/244* (2013.01); *C23C 16/4584* (2013.01); *C23C 16/50* (2013.01);
(Continued)

(58) Field of Classification Search
CPC ............... H01J 37/244; H01J 37/32715; H01J 2237/20214; H01J 2237/24578;
(Continued)

(56) References Cited

U.S. PATENT DOCUMENTS 10,847,350 B2 * 11/2020 Kanno ..................... C23C 16/46
2004/0061057 A1 * 4/2004 Johnson ................. G01K 11/00
250/341.1
(Continued)

FOREIGN PATENT DOCUMENTS

CN 102864438 A * 1/2013 ........... C23C 16/403
CN 107523810 A * 12/2017
(Continued)

OTHER PUBLICATIONS

17089949_2023-09-12_JP_2007107053_A_H.pdf, Apr. 2007.*
(Continued)

*Primary Examiner* — Gail Kaplan Verbitsky
(74) *Attorney, Agent, or Firm* — Venjuris, P.C.

(57) ABSTRACT

A temperature measurement system includes: a thickness calculating unit that calculates an optical thickness of a substrate; a rotation position detecting unit that detects rotation position information of the rotary table; a substrate specifying unit that specifies a substrate based on the rotation position information; a storage unit that stores first relationship information indicating a relationship between a temperature and a thickness associated with each substrate, and second relationship information indicating a relationship between an amount of change in temperature and an amount of change in optical thickness associated with each substrate; and a temperature calculating unit that calculates a temperature of the substrate based on the optical thickness calculated by the thickness calculating unit, the substrate specified by the substrate specifying unit, the first relationship information, and the second relationship information.

12 Claims, 7 Drawing Sheets

(51) Int. Cl.
  *C23C 16/50* (2006.01)
  *C23C 16/52* (2006.01)
  *G01B 11/06* (2006.01)
  *H01J 37/244* (2006.01)
  *H01J 37/32* (2006.01)

(52) U.S. Cl.
  CPC .......... *C23C 16/52* (2013.01); *G01B 11/0616* (2013.01); *G01K 11/00* (2013.01); *H01J 37/32715* (2013.01); *H01J 2237/20214* (2013.01); *H01J 2237/24578* (2013.01); *H01J 2237/24585* (2013.01); *H01J 2237/332* (2013.01)

(58) Field of Classification Search
  CPC ....... H01J 2237/24585; C23C 16/4584; C23C 16/50; C23C 16/52; G01B 11/0616; G01K 11/00
  See application file for complete search history.

(56) References Cited

U.S. PATENT DOCUMENTS

| | | | | |
|---|---|---|---|---|
| 2006/0077394 A1* | 4/2006 | Suzuki | ................ | G01J 5/0003 356/479 |
| 2007/0084847 A1* | 4/2007 | Koshimizu | .............. | G01K 5/48 219/390 |
| 2007/0127034 A1* | 6/2007 | Koshimizu | ........... | G01J 5/0003 356/477 |
| 2019/0013224 A1* | 1/2019 | Chiba | ................ | H01L 21/68771 |
| 2019/0284691 A1* | 9/2019 | Miura | ................ | C23C 16/45536 |

FOREIGN PATENT DOCUMENTS

| | | | | |
|---|---|---|---|---|
| JP | H5166736 | A | * | 7/1993 |
| JP | 2004086975 | A | * | 3/2004 |
| JP | 3593012 | B2 | * | 11/2004 |
| JP | 2007107053 | A | * | 4/2007 |
| JP | 2007107053 | A | * | 4/2007 |
| JP | 2009212178 | A | * | 9/2009 |
| JP | 4447279 | B2 | * | 4/2010 |
| JP | 4806268 | B2 | * | 11/2011 |
| JP | 2012222233 | A | * | 11/2012 |
| JP | 2013-029487 | A | | 2/2013 |
| KR | 10336420 | B1 | * | 12/2013 |
| KR | 101336420 | B1 | * | 12/2013 |
| WO | WO-9417353 | A1 | * | 8/1994 ......... C23C 16/4404 |

OTHER PUBLICATIONS

17089949_2023-09-12_KR_101336420_B1_H.pdf, Dec. 2013.*
17089949_2023-09-12_JP_2004086975_A_H.pdf, Mar. 2004.*
17089949_2023-09-13_JP_4447279_B2_H.pdf, Apr. 2010.*
17089949_2023-09-11_JP_2012222233_A_H.pdf,Nov. 12, 2012.*
17089949_2023-12-19_JP_3593012_B2_H.pdf,Nov. 24, 2004.*
17089949_2023-09-12_JP_2007107053_A_H.pdf,Apr. 26, 2007.*
17089949_2023-09-13_CN_107523810_A_H.pdf,Dec. 29, 2017.*
17089949_2023-09-12_KR_101336420_B1_H.pdf,Dec. 4, 2013.*
17089949_2023-12-19_WO_9417353_A1_H.pdf, Aug. 4, 1994.*
17089949_2023-09-11_JP_4806268_B2_H.pdf,Nov. 2, 2011.*
17089949_2023-12-19_JP_H05166736_A_H.pdf, Jul. 2, 1993.*

* cited by examiner

TEMPERATURE MEASUREMENT SYSTEM, TEMPERATURE MEASUREMENT METHOD, AND SUBSTRATE PROCESSING APPARATUS

CROSS-REFERENCE TO RELATED APPLICATION

This application is based on and claims priority from Japanese Patent Application No. 2019-206738 filed on Nov. 15, 2019 with the Japan Patent Office, the disclosure of which is incorporated herein in its entirety by reference.

TECHNICAL FIELD

The present disclosure relates to a temperature measurement system, a temperature measurement method, and a substrate processing apparatus.

BACKGROUND

As a method of measuring the temperature of a substrate accommodated in a processing container in a non-contact manner, a method of using an optical interference thermometer is known (see, e.g., Japanese Patent Laid-Open Publication No. 2013-029487).

SUMMARY

A temperature measurement system according to an aspect of the present disclosure includes: a thickness calculating unit configured to irradiate a measurement light on a substrate among a plurality of substrates placed along a rotation direction of a rotary table and calculate an optical thickness of each of the substrates based on a reflected light of the measurement light; a rotation position detecting unit configured to detect rotation position information of the rotary table; a substrate specifying unit configured to specify a substrate of which the optical thickness has been calculated by the thickness calculating unit, based on the rotation position information detected by the rotation position detecting unit; a storage unit configured to store first relationship information indicating a relationship between a temperature and a thickness associated with each of the plurality of substrates, and second relationship information indicating a relationship between an amount of change in temperature and an amount of change in optical thickness associated with each of the plurality of substrates; and a temperature calculating unit configured to calculate a temperature of the substrate based on the optical thickness calculated by the thickness calculating unit, the substrate specified by the substrate specifying unit, the first relationship information, and the second relationship information.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
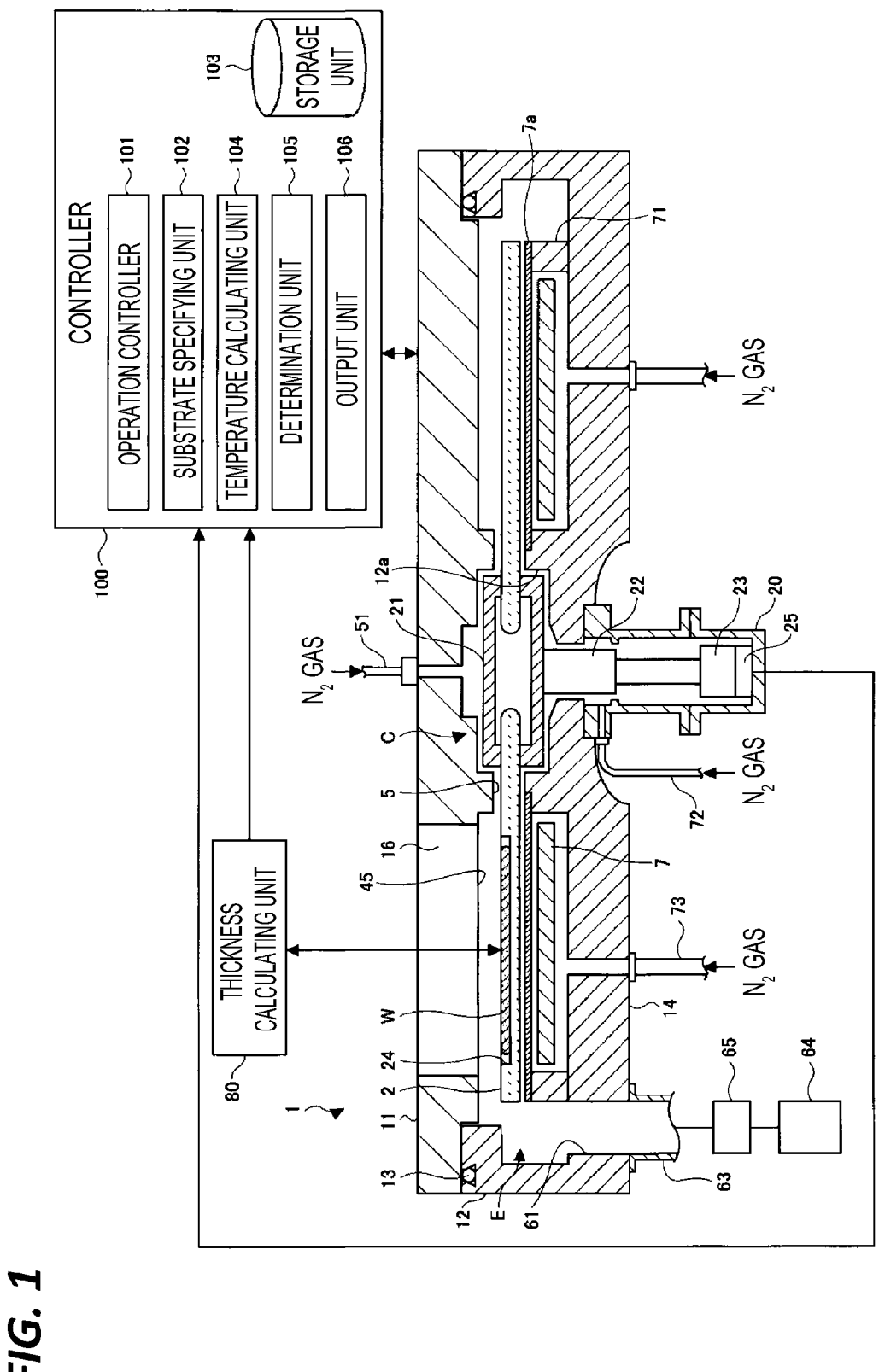
FIG. 1 is a configuration diagram of a temperature measurement system of an embodiment and a substrate processing apparatus using the system.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In the accompanying drawings, the same or corresponding members or parts are denoted by the same or corresponding reference numerals, and redundant explanations thereof are omitted.

<Substrate Processing Apparatus>

Figure 2:
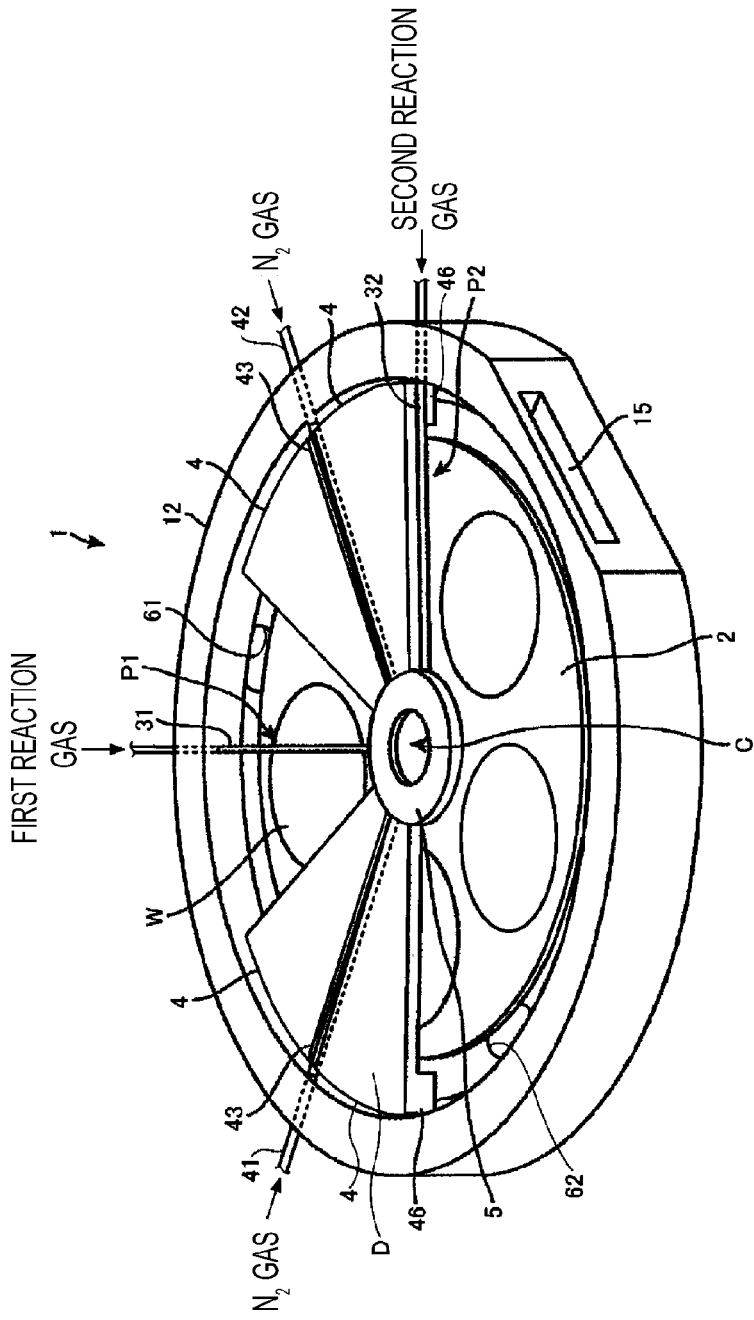
FIG. 2 is a perspective view of an internal structure of the substrate processing apparatus in FIG. 1.

FIG. 1 is a configuration diagram of a temperature measurement system of an embodiment and a substrate processing apparatus using the system. FIG. 2 is a perspective view of an internal structure of the plasma processing apparatus in FIG. 1, and FIG. 3 is a top view of the internal structure of the plasma processing apparatus in FIG. 1.

When the substrate processing apparatus processes a substrate while rotating a rotary table, various substrate processing apparatuses may be applied to such a process. However, in the present embodiment, descriptions will be made on an example in which the substrate processing apparatus is configured as a film forming apparatus.

Figure 3:
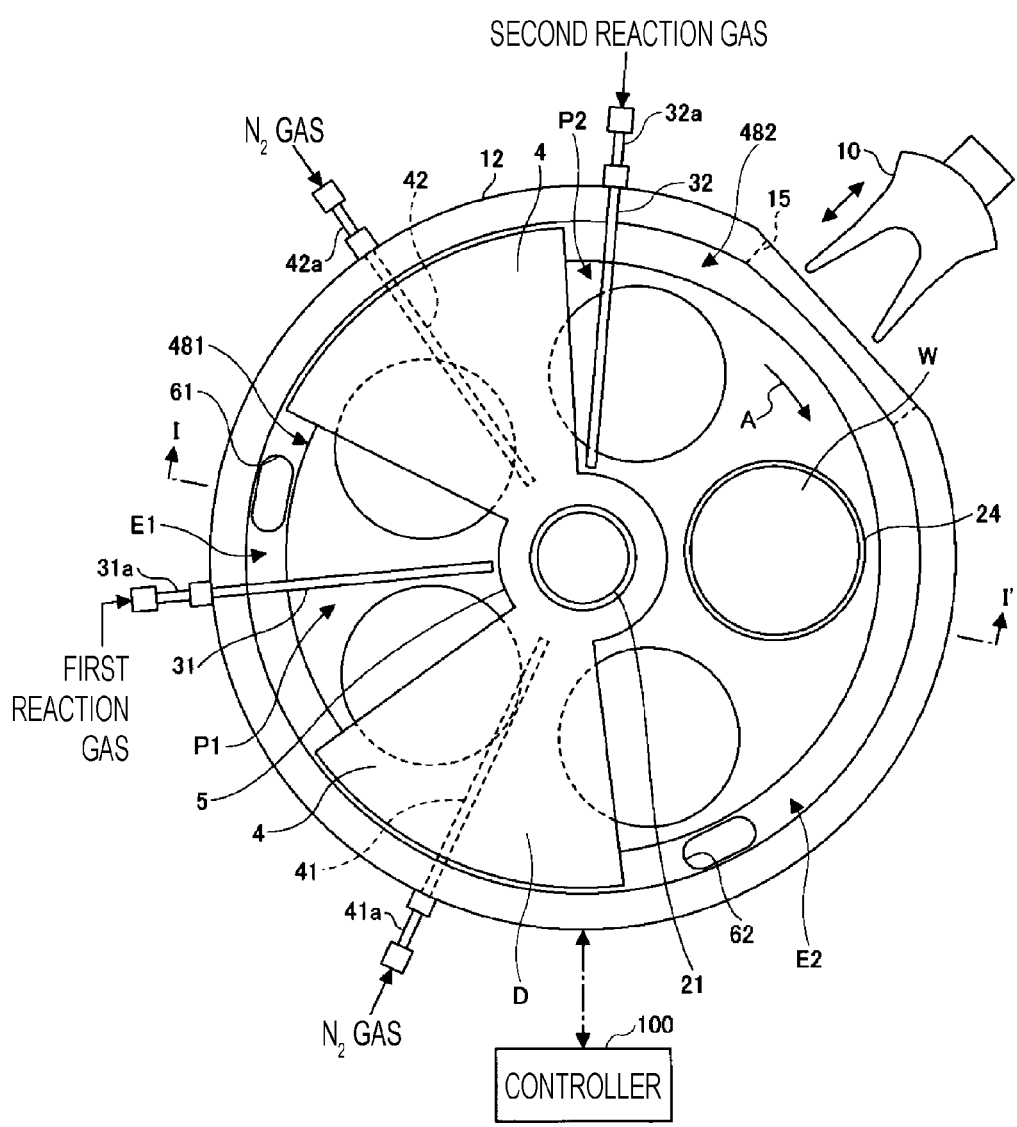
FIG. 3 is a top view of an internal structure of the substrate processing apparatus in FIG. 1.

With reference to FIGS. 1 to 3, the film forming apparatus includes a flat vacuum container 1 having a substantially circular planar shape, and a rotary table 2 provided in the vacuum container 1 and having a rotation center at the center of the vacuum container 1. The vacuum container 1 is a processing chamber in which the inside may be depressurized, and for accommodating a substrate W to be processed and performing a film forming process on the substrate W. The substrate W may be a substrate such as, for example, silicon (Si), quartz ($SiO_2$), silicon carbide (SiC), a low-resistance substrate, or sapphire.

The vacuum container 1 includes a container body 12 having a bottomed cylindrical shape, and a top plate 11 that is airtightly and detachably placed on the upper surface of the container body 12 via a seal member 13 such as, for example, an O-ring (see, e.g., FIG. 1).

The rotary table 2 is a stage on which the substrate W is placed. The rotary table 2 includes a recess 24 having a depression shape on the surface thereof, and supports the substrate on the recess 24. In FIG. 1, a state in which the substrate W is placed on the recess 24 is illustrated. The rotary table 2 is made of, for example, quartz and is fixed to a cylindrical core portion 21 at a central portion.

The core portion 21 is fixed to the upper end of a rotating shaft 22 extending in the vertical direction. The rotating shaft 22 penetrates a bottom portion 14 of the vacuum container 1, and the lower end thereof is attached to a motor 23 that rotates the rotating shaft 22 (see, e.g., FIG. 1) around a vertical axis. The rotating shaft 22 and the motor 23 are accommodated in a tubular case body 20 having an open upper surface. A flange portion provided on the upper surface of the case body 20 is airtightly attached to the lower surface of the bottom portion 14 of the vacuum container 1, and an airtight state between the internal atmosphere and the external atmosphere of the case body 20 is maintained.

The motor 23 is provided with an encoder 25 so that the rotation angle of the rotating shaft 22 may be detected. In the temperature measurement system of the present embodiment, the encoder 25 is used as a rotation position detecting unit that specifies the position of the substrate W placed in the recess 24 on the rotary table 2.

As illustrated in FIGS. 2 and 3, the surface of the rotary table 2 is provided with circular recesses 24 that place a plurality of substrates W (five substrates in the illustrated example) along the rotation direction (circumferential direction). FIG. 3 illustrates the substrate W placed only in a single recess 24 for convenience. The recess 24 has an inner diameter slightly greater than the diameter of the substrate W by, for example, 4 mm, and a depth substantially equal to or greater than the thickness of the substrate W. Therefore, when the substrate W is accommodated in the recess 24, the surface of the substrate W and the surface of the rotary table 2 (the region where the substrate W is not placed) have the same height, or the surface of the substrate W becomes lower than the surface of the rotary table 2. Even when the depth of the recess 24 is greater than the thickness of the substrate W, when the depth is set to be too great, the film formation is affected. Thus, it is preferable to set the depth to about three times the thickness of the substrate W. On the bottom surface of the recess 24, through holes (none of which are illustrated) are formed through which, for example, three lifting pins for supporting the back surface of the substrate W and raising and lowering the substrate W pass.

FIGS. 2 and 3 are views for explaining the structure inside the vacuum container 1, and the top plate 11 is omitted for convenience of explanation. As illustrated in FIGS. 2 and 3, reaction gas nozzles 31 and 32 made of, for example, quartz and separation gas nozzles 41 and 42, respectively, are placed above the rotary table 2 at intervals in the circumferential direction of the vacuum container 1 (the rotation direction of the rotary table 2 (see the arrow A in FIG. 3)). In the illustrated example, the separation gas nozzle 41, the reaction gas nozzle 31, the separation gas nozzle 42, and the reaction gas nozzle 32 are placed in this order in the clockwise direction (rotation direction of the rotary table 2) from a transfer port 15 described later.

The reaction gas nozzles 31 and 32 are introduced into the vacuum container 1 from an outer peripheral wall of the vacuum container 1 by fixing gas introduction ports 31a and 32a, which are the base ends, to the outer peripheral wall of the container body 12, and are attached to extend horizontally with respect to the rotary table 2 along the radial direction of the container body 12. The reaction gas nozzle 31 is connected to a first reaction gas supply source (not illustrated) via a pipe (not illustrated) and a flow rate controller. The reaction gas nozzle 32 is connected to a second reaction gas supply source (not illustrated) via a pipe (not illustrated) and a flow rate controller.

In the reaction gas nozzles 31 and 32, a plurality of gas discharge holes 33 that opens toward the rotary table 2 (see, e.g., FIG. 4) is placed along the length direction of the reaction gas nozzles 31 and 32, for example, at intervals of 10 mm. A lower region of the reaction gas nozzle 31 is a first processing region P1 that adsorbs a first reaction gas on the substrate W. A lower region of the reaction gas nozzle 32 is a second processing region P2 in which the first reaction gas adsorbed on the substrate W and the second reaction gas react with each other in the first processing region P1.

The separation gas nozzles 41 and 42 are introduced into the vacuum container 1 from an outer peripheral wall of the vacuum container 1 by fixing gas introduction ports 41a and 42a, which are the base ends, to the outer peripheral wall of the container body 12, and are attached to extend horizontally with respect to the rotary table 2 along the radial direction of the container body 12. The separation gas nozzles 41 and 42 are all connected to, for example, a nitrogen ($N_2$) gas supply source (not illustrated) as a separation gas via a pipe (not illustrated) and a flow rate control valve.

With reference to FIGS. 2 and 3, two convex portions 4 are provided in the vacuum container 1. Since the convex portion 4 constitutes a separation region D together with the separation gas nozzles 41 and 42, the convex portion 4 is attached to the back surface of the top plate 11 so as to protrude toward the rotary table 2 as described later. Further, the convex portion 4 has a fan-shaped planar shape whose top is cut into an arc shape. In the present embodiment, the inner arc is connected to a protrusion 5 (to be described later) and the outer arc is placed along the inner peripheral surface of the container body 12 of the vacuum container 1.

Figure 4:
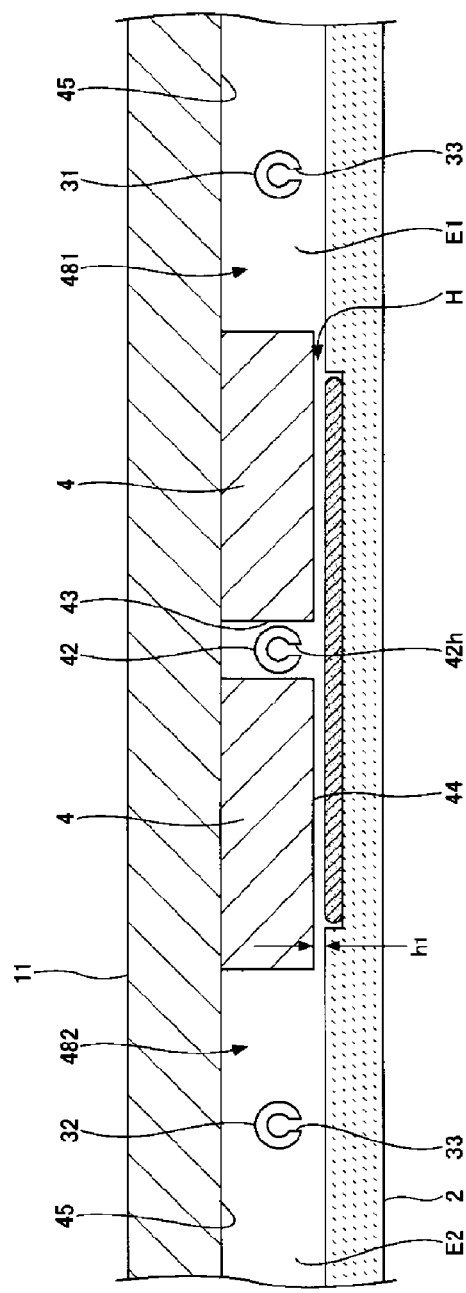
FIG. 4 is a cross-sectional view taken along the concentric circles of the rotary table of the substrate processing apparatus in FIG. 1.

FIG. 4 illustrates a cross section of the vacuum container 1 along the concentric circles of the rotary table 2 from the reaction gas nozzle 31 to the reaction gas nozzle 32. As illustrated in the figure, the convex portion 4 is attached to the back surface of the top plate 11. Therefore, in the vacuum container 1, there are a first ceiling surface 44, which is a flat low ceiling surface which is the lower surface of the convex portion 4, and a second ceiling surface 45, which is located on both sides of the first ceiling surface 44 in the circumferential direction and is higher than the first ceiling surface 44.

The first ceiling surface 44 has a fan-shaped planar shape whose top is cut into an arc shape. Further, as illustrated in the figure, a groove 43 configured to extend in the radial direction is formed in the convex portion 4 at the center in the circumferential direction, and the separation gas nozzle 42 is accommodated in the groove 43. A groove 43 is also formed in the other convex portion 4, and the separation gas nozzle 41 is accommodated in the groove 43.

Further, the reaction gas nozzles 31 and 32 are provided in the space below the second ceiling surface 45, respectively. The reaction gas nozzles 31 and 32 are provided in the vicinity of the substrate W to be spaced apart from the second ceiling surface 45. Further, as illustrated in FIG. 4, the reaction gas nozzle 31 is provided in a space 481 on the right side below the second ceiling surface 45, and the reaction gas nozzle 32 is provided in a space 482 on the left side below the second ceiling surface 45.

Further, in the separation gas nozzle 42 accommodated in the groove 43 of the convex portion 4, a plurality of discharge holes 42h that opens toward the rotary table 2 (see, e.g., FIG. 4) is placed along the length direction of the separation gas nozzle 42, for example, at intervals of 10 mm. Further, in the separation gas nozzle 41 accommodated in the groove 43 of the other convex portion 4, a plurality of discharge holes 41h that opens toward the rotary table 2 (not illustrated) is placed along the length direction of the separation gas nozzle 41, for example, at intervals of 10 mm.

The first ceiling surface 44 forms a separation space H, which is a narrow space, with respect to the rotary table 2. When $N_2$ gas is supplied from the discharge hole 42h of the separation gas nozzle 42, the $N_2$ gas flows toward the spaces 481 and 482 through the separation space H. At this time, since the volume of the separation space H is smaller than the volume of the spaces 481 and 482, the pressure of the separation space H may be made higher than the pressure of the spaces 481 and 482 by the $N_2$ gas. That is, the separation space H having a high pressure is formed between the spaces 481 and 482. Further, the $N_2$ gas flowing from the separation space H to the spaces 481 and 482 acts as a counterflow to the first reaction gas from the first processing region P1 and the second reaction gas from the second processing region P2. Therefore, the first reaction gas from the first processing region P1 and the second reaction gas from the second processing region P2 are separated by the separation space H. As a result, it is suppressed that the first reaction gas and the second reaction gas are mixed and reacted in the vacuum container 1.

A height h1 of the first ceiling surface 44 with respect to the upper surface of the rotary table 2 is set to a height suitable for making the pressure of the separation space H higher than the pressure of the spaces 481 and 482, in consideration of the pressure in the vacuum container 1 at the time of film formation, the rotation speed of the rotary table 2, and the flow rate of the separated gas to be supplied.

Meanwhile, the protrusion 5 (see, e.g., FIGS. 2 and 3) is provided on the lower surface of the top plate 11 to surround the outer periphery of a core portion 21 for fixing the rotary table 2. In the present embodiment, the protrusion 5 is continuous with a portion on the rotation center side of the convex portion 4, and the lower surface thereof is formed at the same height as the first ceiling surface 44.

FIG. 1 referred to above is a cross-sectional view taken along the line I-I' of FIG. 3, and illustrates a region where the second ceiling surface 45 is provided. Meanwhile, FIG. 5 is a cross-sectional view illustrating a region where the first ceiling surface 44 is provided.

Figure 5:
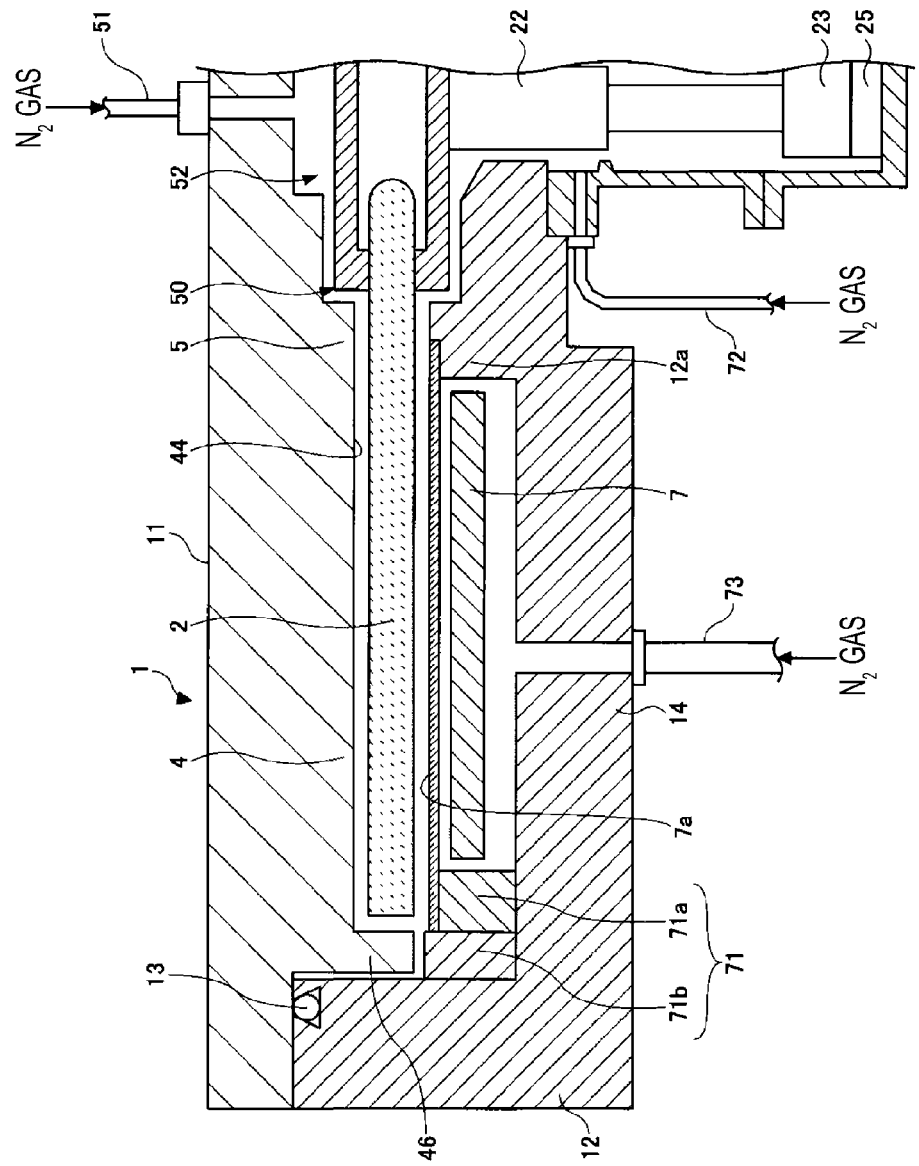
FIG. 5 is a cross-sectional view illustrating a region where a ceiling surface of a processing container of the substrate processing apparatus in FIG. 1 is provided.

As illustrated in FIG. 5, a bent portion 46 that bends in an L shape to face the outer end surface of the rotary table 2 is formed on the peripheral portion of the fan-shaped convex portion 4 (the portion on the outer edge side of the vacuum container 1). Similar to the convex portion 4, the bent portion 46 suppresses the invasion of the reaction gas from both sides of the separation region D, and suppresses the mixing of both reaction gases. Since the fan-shaped convex portion 4 is provided on the top plate 11 and the top plate 11 is removable from the container body 12, there is a slight gap between the outer peripheral surface of the bent portion 46 and the container body 12. A gap between the inner peripheral surface of the bent portion 46 and the outer end surface of the rotary table 2, and a gap between the outer peripheral surface of the bent portion 46 and the container body 12 are set to the same dimension as, for example, the height of the first ceiling surface 44 with respect to the upper surface of the rotary table 2.

The inner peripheral wall of the container body 12 is formed in a vertical surface which is close to the outer peripheral surface of the bent portion 46 in the separation region D (see, e.g., FIG. 4), but is recessed outward, for example, from a portion facing the outer end surface of the rotary table 2 to the bottom portion 14 in the portion other than the separation region D (see, e.g., FIG. 1). Hereinafter, for convenience of explanation, a recessed portion having a substantially rectangular cross-sectional shape is referred to as an exhaust region. Specifically, an exhaust region that communicates with the first processing region P1 is referred to as a first exhaust region E1, and a region that communicates with the second processing region P2 is referred to as a second exhaust region E2.

As illustrated in FIGS. 1 to 3, a first exhaust port 61 and a second exhaust port 62 are formed at the bottom portions of the first exhaust region E1 and the second exhaust region E2, respectively. As illustrated in FIG. 1, the first exhaust port 61 and the second exhaust port 62 are each connected to an exhaust device, for example, a vacuum pump 64, via an exhaust pipe 63. Further, a pressure controller 65 is provided in the exhaust pipe 63 placed between the first exhaust port 61 and the vacuum pump 64. Similarly, a pressure controller 65 is provided in the exhaust pipe 63 placed between the second exhaust port 62 and the vacuum pump 64.

A heater unit 7 is provided in the space between the rotary table 2 and the bottom portion 14 of the vacuum container 1, as illustrated in FIGS. 1 and 5, and the substrate W on the rotary table 2 is heated to a temperature (e.g., 450 ° C.) determined by a process recipe via the rotary table 2. An annular cover member 71 is provided below the vicinity of the peripheral edge of the rotary table 2 (see, e.g., FIG. 5).

The cover member 71 divides the atmosphere from the space above the rotary table 2 to the first exhaust region E1 and the second exhaust region E2 and the atmosphere in which the heater unit 7 is placed, thereby suppressing the invasion of gas into the region below the rotary table 2. The cover member 71 includes an inner member 71a which is provided to face an outer edge portion of the rotary table 2 and the outer peripheral side of the outer edge portion from below, and an outer member 71b which is provided between the inner member 71a and the inner wall surface of the vacuum container 1. The outer member 71b is provided in the separation region D below the bent portion 46 formed on the outer edge portion of the convex portion 4 and in close proximity to the bent portion 46. The inner member 71a surrounds the heater unit 7 over the entire circumference below the outer edge portion of the rotary table 2 (and below the portion slightly outside the outer edge portion).

The bottom portion 14 at a portion which is closer to the center of rotation than the space in which the heater unit 7 is placed protrudes upward so as to approach the core portion 21 near the center portion of the lower surface of the rotary table 2 to form a protrusion 12a. Since a space between the protrusion 12a and the core portion 21 is narrow, and a gap between the inner peripheral surface of a through hole of the rotating shaft 22 penetrating the bottom portion 14 and the rotating shaft 22 is narrow, these narrow spaces communicate with the case body 20. The case body 20 is provided with a purge gas supply pipe 72 that supplies the $N_2$ gas, which is a purge gas, into a narrow space for purging. Further, the bottom portion 14 of the vacuum container 1 is provided with a plurality of purge gas supply pipes 73 that purges an arrangement space of the heater unit 7 at predetermined angular intervals in the circumferential direction below the heater unit 7 (FIG. 5 illustrates a single purge gas supply pipe 73). In addition, in order to suppress the invasion of gas into the region where the heater unit 7 is provided, a lid member 7a is provided between the heater unit 7 and the rotary table 2 so as to cover from the inner peripheral wall of the outer member 71b (the upper surface of the inner member 71a) to the upper end of the protrusion 12a in the circumferential direction. The lid member 7a may be made of, for example, quartz.

Further, a separation gas supply pipe 51 is connected to the central portion of the top plate 11 of the vacuum container 1, and configured to supply the $N_2$ gas, which is a separation gas, to the space 52 between the top plate 11 and the core portion 21. The separation gas supplied to the space 52 is discharged toward the peripheral edge along the surface of the rotary table 2 on the recess 24 side via a narrow space 50 between the protrusion 5 and the rotary table 2. The space 50 may be maintained at a pressure higher than the spaces 481 and 482 by the separation gas. Therefore, the space 50 suppresses mixing of the first reaction gas supplied to the first processing region P1 and the second reaction gas supplied to the second processing region P2 through a central region C. That is, the space 50 (or the central region C) functions in the same manner as the separation space H (or the separation region D).

As illustrated in FIGS. 2 and 3, the transfer port 15 is formed on the side wall of the vacuum container 1 to deliver the substrate W between an external transfer arm 10 and the rotary table 2. The transfer port 15 is opened and closed by a gate valve (not illustrated). Further, the substrate W is delivered to and from the transfer arm 10 at a position facing the transfer port 15 in the recess 24, which is a substrate placing area in the rotary table 2. Therefore, a lifting pin for delivery and a lifting mechanism thereof (neither of which is illustrated) for lifting the substrate W from the back surface through the recess 24 are provided at a portion below the rotary table 2 corresponding to the delivery position.

A window 16 is formed on a part of the top plate 11. The window 16 is provided with, for example, quartz glass, and is configured so that the inside of the vacuum container 1 may be visually recognized.

Figure 6:
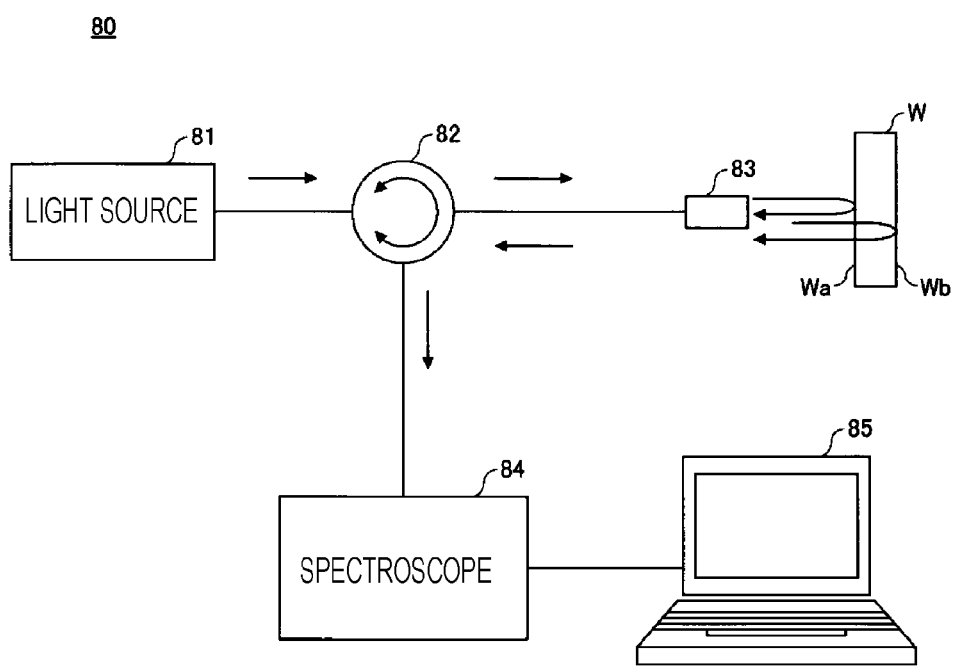
FIG. 6 is a diagram illustrating an example of a thickness calculating unit.

A thickness calculating unit 80 is provided above the window 16 of the top plate 11. FIG. 6 is a diagram illustrating an example of the thickness calculating unit 80. In the present embodiment, the thickness calculating unit 80 includes a light source 81, an optical circulator 82, a collimator 83, a spectroscope 84, and an arithmetic device 85.

The light source 81 generates measurement light having a wavelength transmitted through the substrate W. In the present embodiment, the light source 81 is a low coherence light source that emits low coherence light. The low coherence light has lower coherence than coherent light and higher coherence than incoherent light, and is light in which interference fringes between the reflected light from a front surface Wa of the substrate W and the reflected light from a back surface Wb thereof are generated when used as the emitted light. The low coherence light source may be, for example, a super luminescent diode (SLD) light source.

The optical circulator 82 is connected to the light source 81, the collimator 83, and the spectroscope 84. The optical circulator 82 emits the measurement light generated by the light source 81 to the collimator 83. The collimator 83 emits the measurement light to the front surface Wa of the substrate W. The collimator 83 emits measurement light adjusted as parallel light rays to the substrate W. Then, the collimator 83 causes the reflected light from the substrate W to be incident. The reflected light includes not only the reflected light of the front surface Wa of the substrate W but also the reflected light of the back surface Wb. The collimator 83 emits the reflected light to the optical circulator 82. The optical circulator 82 emits the reflected light to the spectroscope 84.

The spectroscope 84 measures the interference spectrum generated by the reflected light from the front surface Wa and the back surface Wb of the substrate W. The spectroscope 84 outputs the interference spectrum to the arithmetic device 85.

The arithmetic device 85 converts the interference spectrum output by the spectroscope 84 into an interference signal by inverse Fourier transform, and calculates the optical path length (optical thickness) of the substrate W from the peak interval of the interference signal.

A controller 100 executes the temperature measurement method described later by controlling each unit of the film forming apparatus. The controller 100 may be, for example, a computer. Further, the computer program that operates each unit of the film forming apparatus is stored in a storage medium. The storage medium may be, for example, a flexible disk, a compact disk, a hard disk, a flash memory, or a DVD.

The controller 100 includes an operation controller 101, a substrate specifying unit 102, a storage unit 103, a temperature calculating unit 104, a determination unit 105, and an output unit 106.

The operation controller 101 controls the operation of each unit of the film forming apparatus. In the present embodiment, the operation controller 101 controls various operations including the loading and unloading operations of the substrate W, the rotating and stopping operations of the rotary table 2, the gas supply operation, and the exhaust operation in the vacuum container 1.

The substrate specifying unit 102 specifies the substrate W of which the optical thickness has been calculated by the thickness calculating unit 80, based on the rotation position information of the rotary table 2 detected by the encoder 25. In the present embodiment, the substrate specifying unit 102 specifies a slot number of the recess 24 located below the thickness calculating unit 80, and specifies the substrate W placed in the recess 24 of the slot number based on the rotation position information of the rotary table 2 detected by the encoder 25, The storage unit 103 stores various information including first relationship information and second relationship information.

The first relationship information indicates a relationship between the temperature and the thickness associated with each substrate W. The first relationship information is generated by measuring the thickness of the substrate W with various measuring devices, for example, in a state where the substrate W is heated to a predetermined temperature in a heating furnace such as an oven. Further, the first relationship information may be generated by measuring the thickness of the substrate W with various measuring devices in a state where the substrate W is heated to a predetermined temperature in the vacuum container 1 of the film forming apparatus. The various measuring devices may be, for example, a measuring device for measuring the thickness of a substrate by a non-contact optical method, or a measuring device for measuring the thickness of a substrate by a contact method. The first relationship information is determined as, for example, "substrate:temperature:thickness=wafer X:100° C.:775 μm" or "substrate:temperature:thickness=wafer Y:100° C.:777 μm." "Substrate:temperature:thickness=wafer X:100° C.:775 μm" means that the thickness of the wafer X at 100° C. is 775 μm. Also, "substrate:temperature:thickness=wafer X:100° C.:777 μm" means that the thickness of the wafer X at 100° C. is 777 μm.

The second relationship information indicates the relationship between an amount of change in temperature and an amount of change in optical thickness associated with each substrate W. The second relationship information is determined for each material of the substrate W. For example, when the material of the substrate W is silicon, the amount of change in optical thickness is determined as Δ(nd)=0.2

µm/° C. Further, for example, when the material of the substrate W is quartz, the amount of change in optical thickness is determined as Δ(nd)=0.02 µm/° C. In the formula, the symbol "n" represents the refractive index of the substrate W, and the symbol "d" represents the thickness of the substrate W.

The temperature calculating unit 104 calculates the temperature of the substrate W based on the optical thickness of the substrate W calculated by the thickness calculating unit 80, the substrate W specified by the substrate specifying unit 102, and the first and second relationship information stored in the storage unit 103. The first relationship information and the second relationship information are each associated with the substrate W specified by the substrate specifying unit 102. For example, when the optical thickness of the substrate W is "795 µm," the substrate W is a "silicon wafer," the first relationship information is "temperature:thickness=100° C.:775 µm," and the second relationship information is "Δ(nd)=0.2 µm/° C.," the temperature of the substrate W is calculated by the following formula.

[Temperature of substrate W]=100+(795−775)/ 0.2=200° C.

The determination unit 105 determines whether the temperature difference among the plurality of substrates W calculated by the temperature calculating unit 104 is within a predetermined threshold value. The temperature difference among the plurality of substrates W may be, for example, a difference between the maximum temperature and the minimum temperature among the temperatures of the plurality of substrates W. The threshold value is set in advance by an administrator. Further, the determination unit 105 determines whether the condition for ending the measurement of the temperature of the substrate W has been satisfied. For example, when a predetermined time has elapsed from the start of the calculation of the optical thickness of the substrate W by the thickness calculating unit 80, the controller 100 determines that the condition for ending the measurement of the temperature of the substrate W has been satisfied. In addition, the determination unit 105 determines whether a predetermined temperature stabilization time has elapsed.

The output unit 106 outputs an alarm based on the temperature difference among the plurality of substrates W calculated by the temperature calculating unit 104. For example, the output unit 106 sounds an alarm sound, displays an alarm screen, and transmits an alarm signal to a host controller (e.g., a host controller).

The encoder 25, the thickness calculating unit 80, and the controller 100 constitute a temperature measurement system for measuring the temperature of the substrate W placed in the recess 24 of the rotary table 2.

Further, the above example represents a case where the arithmetic device 85 of the thickness calculating unit 80 calculates the optical thickness of the substrate W based on the interference spectrum, but the present disclosure is not limited thereto. For example, the controller 100 may be configured to calculate the optical thickness of the substrate W based on the interference spectrum instead of the arithmetic device 85.

Further, the above example represents a case where the storage unit 103 of the controller 100 stores the first relationship information and the second relationship information, but the present disclosure is not limited thereto. For example, the thickness calculating unit 80 may be configured to store at least one of the first relationship information and the second relationship information.

[Temperature Measurement Method]

Figure 7:
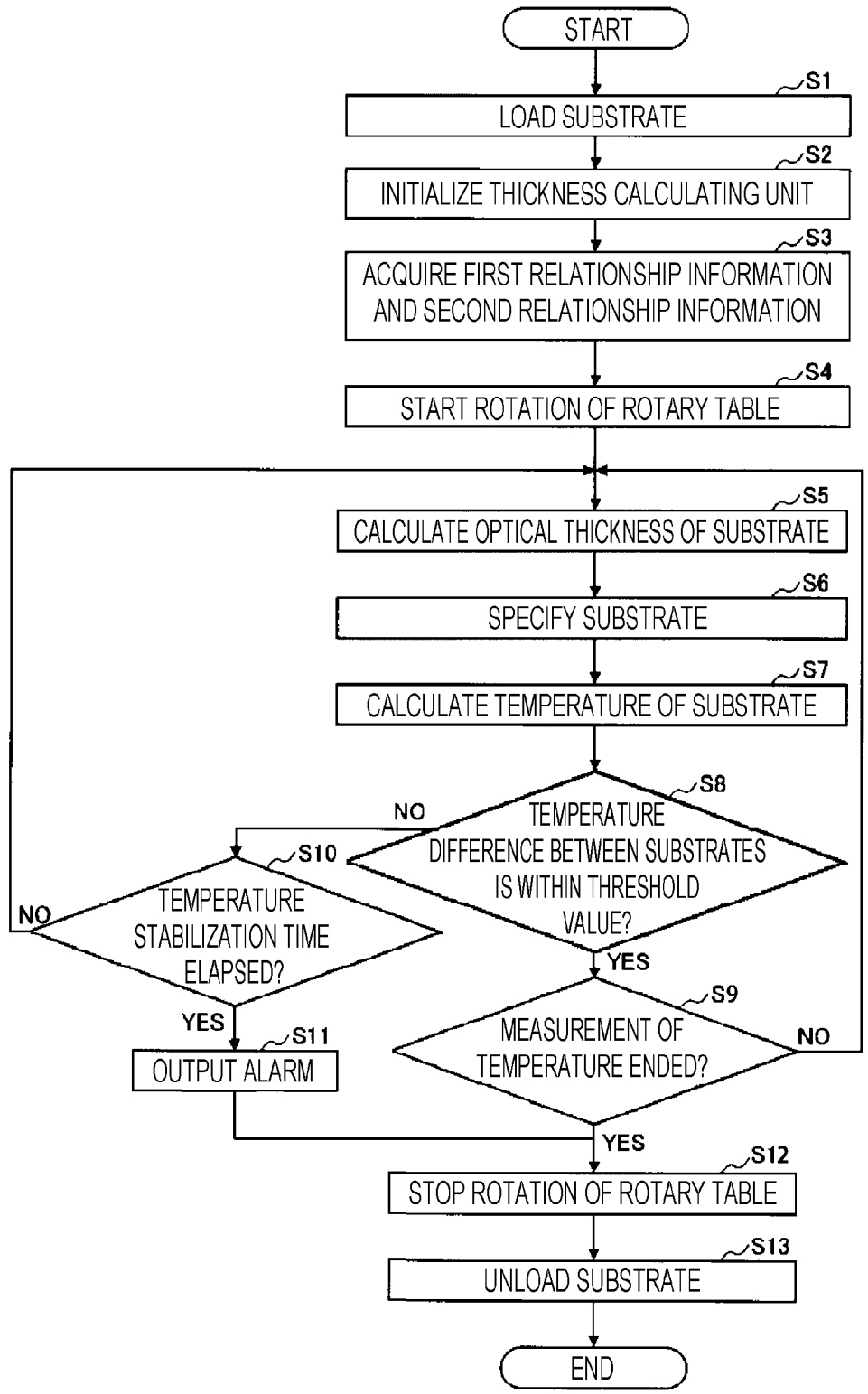
FIG. 7 is a flowchart illustrating an example of a temperature measurement method according to the temperature measurement system of the embodiment.

FIG. 7 is a flowchart illustrating an example of a temperature measurement method according to the temperature measurement system of the embodiment. The temperature measurement method of the embodiment includes steps S1 to S13. In the following, descriptions will be made on a case where the temperature of the substrate W placed on each of the five recesses 24 of the rotary table 2 is measured.

In step S1, the controller 100 controls each unit of the film forming apparatus to load the substrate W into the vacuum container 1. In the present embodiment, the controller 100 places the substrate W in each of the five recesses 24 formed in the rotary table 2. The substrate W may be, for example, a bare wafer.

In step S2, the controller 100 initializes the thickness calculating unit 80. The initialization by the thickness calculating unit 80 includes, for example, the initialization of the spectroscope 84.

In step S3, the controller 100 acquires the first relationship information indicating the relationship between the temperature and the thickness associated with each substrate W, and the second relationship information indicating the relationship between an amount of change in temperature and an amount of change in optical thickness associated with each substrate W, which are stored in the storage unit 103. The first relationship information is generated by measuring the thickness of the substrate W with various measuring devices, for example, in a state where the substrate W is heated to a predetermined temperature in a heating furnace such as an oven. The various measuring devices may be, for example, a measuring device for measuring the thickness of a substrate by a non-contact optical method, or a measuring device for measuring the thickness of a substrate by a contact method. The second relationship information is determined for each material of the substrate W. For example, when the material of the substrate W is silicon and the amount of change in optical thickness is Δ(nd), the second relationship information is determined as Δ(nd)=0.2 µm/° C. Also, for example, when the material of the substrate W is quartz, the second relationship information is determined as Δ(nd)=0.02 µm/° C.

In step S4, the controller 100 starts the rotation of the rotary table 2. As a result, the substrates W placed on the recesses 24 formed in the rotary table 2 pass below the thickness calculating unit 80 in order.

In step S5, the thickness calculating unit 80 irradiates the substrate W with the measurement light and calculates the optical thickness of the substrate W based on the reflected light of the measurement light. In the present embodiment, the thickness calculating unit 80 irradiates the substrate W with the measurement light from the light source 81, measures the interference spectrum generated by the reflected light from the front surface Wa and the back surface Wb of the substrate W by the spectroscope 84, and calculates the optical thickness of the substrate W based on the interference spectrum by the arithmetic device 85.

In step S6, the controller 100 specifies the substrate W for which the thickness calculating unit 80 has calculated the optical thickness based on the rotation position information of the rotary table 2 detected by the encoder 25. In the present embodiment, the controller 100 specifies a slot number of the recess 24 located below the thickness calculating unit 80, and the substrate W placed in the recess 24 of the slot number based on the rotation position information of the rotary table 2 detected by the encoder 25.

In step S7, the controller 100 calculates the temperature of the substrate W based on the optical thickness of the substrate W calculated in step S5, the substrate W specified in step S6, and the first relationship information and the second relationship information acquired in step S3. For example, when the optical thickness of the substrate W is "795 μm," the substrate W is a "silicon wafer," the first relationship information is "temperature:thickness=100° C.:775 μm," and the second relationship information is "Δ(nd)=0.2 μm/° C.," the temperature of the substrate W is calculated by the following formula.

[Temperature of substrate W]=100+(795−775)/0.2=200° C.

In step S8, the controller 100 determines whether the temperature difference among five substrates W calculated in step S7 is within a predetermined threshold value. The temperature difference among the five substrates W may be, for example, a difference between the maximum temperature and the minimum temperature among the temperatures of the five substrates W. When it is determined in step S8 that the temperature difference among the five substrates W is within a predetermined threshold value, the controller 100 advances the process to step S9. Meanwhile, when it is determined in step S8 that the temperature difference among the five substrates W is not within a predetermined threshold value, the controller 100 advances the process to step S10.

In step S9, the controller 100 determines whether the condition for ending the measurement of the temperature of the substrate W has been satisfied. For example, when a predetermined time has elapsed from the start of the calculation of the optical thickness of the substrate W in step S5, the controller 100 determines that the condition for ending the measurement of the temperature of the substrate W has been satisfied. When it is determined that the condition for ending the measurement of the temperature of the substrate W has been satisfied, the controller 100 advances the process to step S12. Meanwhile, when it is determined that the condition for ending the measurement of the temperature of the substrate W has not been satisfied, the controller 100 returns the process to step S5.

In step S10, the controller 100 determines whether a predetermined temperature stabilization time has elapsed since the rotation of the rotary table 2 was started in step S4. When it is determined in step S10 that the predetermined temperature stabilization time has elapsed, the controller 100 advances the process to step S11. Meanwhile, when it is determined in step S10 that the predetermined temperature stabilization time has not elapsed, the controller 100 returns the process to step S5.

In step S11, the controller 100 outputs an alarm. For example, the controller 100 sounds an alarm sound, displays an alarm screen, and transmits an alarm signal to a host controller (e.g., a host controller).

In step S12, the controller 100 stops the rotation of the rotary table 2.

In step S13, the controller 100 controls each unit of the film forming apparatus to unload the substrate W from the vacuum container 1. In the present embodiment, the controller 100 unloads the substrate W in each of the five recesses 24 formed in the rotary table 2. After step S13, the process ends.

As described above, according to the embodiment, the temperature calculating unit 104 calculates the temperature of the substrate W based on the optical thickness of the substrate W calculated by the thickness calculating unit 80, the substrate W specified by the substrate specifying unit 102, and the first and second relationship information stored in the storage unit 103. As a result, a single thickness calculating unit 80 may accurately measure the temperatures of the plurality of substrates W accommodated in the vacuum container 1.

In the above embodiment, descriptions have been made on the case where the rotary table has five recesses, but the present disclosure is not limited thereto. For example, the rotary table may have four or less recesses, or may have six or more recesses.

According to the present disclosure, it is possible to accurately measure the temperature of a plurality of substrates accommodated in a processing container.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A temperature measurement system comprising:
a thickness calculator configured to irradiate a measurement light on a substrate among a plurality of substrates evenly placed along a rotation direction of a rotary table and calculate an optical thickness of the substrate based on a reflected light of the measurement light;
a rotation position detector configured to detect rotation position information of the rotary table;
a substrate specifier configured to specify a substrate of which the optical thickness has been calculated by the thickness calculator, based on the rotation position information detected by the rotation position detector;
a storage configured to store first relationship information indicating a relationship between a temperature and a thickness associated with each of the plurality of substrates, and second relationship information indicating a relationship between an amount of change in temperature and an amount of change in optical thickness associated with each of the plurality of substrates; and
a temperature calculator configured to calculate a temperature of the substrate based on the optical thickness calculated by the thickness calculator, the substrate specified by the substrate specifier, the first relationship information, and the second relationship information.

2. The temperature measurement system according to claim 1, wherein the thickness calculator calculates the optical thickness of the substrate based on an interference spectrum generated by a reflected light from a front surface and a back surface of the substrate.

3. The temperature measurement system according to claim 2, wherein the rotation position detector includes an encoder.

4. The temperature measurement system according to claim 3, wherein the rotary table is provided inside a vacuum container, and the thickness calculator is provided outside the vacuum container to be spaced apart from the rotary table.

5. The temperature measurement system according to claim 4, further comprising:
an alarm configured to output an alarm signal based on a temperature difference among the plurality of substrates calculated by the temperature calculating unit.

6. The temperature measurement system according to claim 1, wherein the rotation position detector includes an encoder.

7. The temperature measurement system according to claim 1, wherein the rotary table is provided inside a vacuum container, and the thickness calculator is provided outside the vacuum container to be spaced apart from the rotary table.

8. The temperature measurement system according to claim 1, further comprising:
an alarm configured to output an alarm signal based on a temperature difference among the plurality of substrates calculated by the temperature calculator.

9. A temperature measurement method comprising:
evenly placing a plurality of substrates along a rotation direction of a rotary table;
irradiating a measurement light on a substrate among the plurality of substrates and calculating an optical thickness of the substrate based on a reflected light of the measurement light;
detecting rotation position information of the rotary table;
specifying the substrate of which the optical thickness has been calculated; and
calculating a temperature of the substrate based on the optical thickness calculated in the calculating, the substrate specified in the specifying, first relationship information indicating a relationship between a temperature and a thickness associated with the substrate, and second relationship information indicating a relationship between an amount of change in temperature and an amount of change in optical thickness associated with the substrate.

10. The method according to claim 9, wherein the calculating of the optical thickness, the detecting of the rotation position information, the specifying of the substrate, and the calculating of the temperature of the substrate are executed for each of the plurality of substrates.

11. The temperature measurement method according to claim 10, further comprising:
outputting an alarm based on a temperature difference among the plurality of calculated substrates.

12. A plasma processing apparatus comprising:
a vacuum container;
a rotary table rotatably provided inside the vacuum container and configured to receive a plurality of substrates evenly placed thereon along a rotation direction of the rotary table;
a thickness calculator configured to irradiate a measurement light on a substrate among the plurality of substrates and calculate an optical thickness of the substrate based on a reflected light of the measurement light;
a rotation position detector configured to detect rotation position information of the rotary table;
a substrate specifier configured to specify a substrate of which the optical thickness has been calculated by the thickness calculator, based on the rotation position information detected by the rotation position detector;
a storage configured to store first relationship information indicating a relationship between a temperature and a thickness associated with each of the plurality of substrates, and second relationship information indicating a relationship between an amount of change in temperature and an amount of change in optical thickness associated with each of the plurality of substrates; and
a temperature calculator configured to calculate a temperature of the substrate based on the optical thickness calculated by the thickness calculator, the substrate specified by the substrate specifier, the first relationship information, and the second relationship information.

* * * * *